United States Patent [19]
Krakirian

[11] Patent Number: 5,946,707
[45] Date of Patent: Aug. 31, 1999

[54] INTERLEAVED BURST XOR USING A SINGLE MEMORY POINTER

[75] Inventor: Shahe H. Krakirian, Milpitas, Calif.

[73] Assignee: Adaptec, Inc., Milpitas, Calif.

[21] Appl. No.: 08/808,526

[22] Filed: Feb. 28, 1997

[51] Int. Cl.$^6$ .................................................. G06F 12/00
[52] U.S. Cl. ..................... 711/112; 711/114; 711/111; 395/182.04
[58] Field of Search ............................. 395/825, 182.04; 711/114, 112

[56] References Cited

U.S. PATENT DOCUMENTS

| 5,191,584 | 3/1993 | Anderson | 395/182.04 |
| 5,519,844 | 5/1996 | Stallmo | 711/114 |
| 5,555,437 | 9/1996 | Packer | 395/825 |

Primary Examiner—John W. Cabeca
Assistant Examiner—David Langjahr
Attorney, Agent, or Firm—Skjerven, Morrill, MacPherson Franklin and Friel; Fabio E. Marino

[57] ABSTRACT

A method and apparatus for performing XOR operations on a hard disk drive are provided, which optimize the buffer bandwidth with minimal logic added to the hard disk controller integrated circuit. This is achieved by first storing data from a first source in the buffer memory in an interleaved fashion (i.e. at memory locations having addresses k, k+2 . . . ,k+2n−2) and then sequentially reading each bit set from the buffer memory, XORing it with a corresponding bit set read from a second source and writing the result at the next consecutive location in the buffer memory (i.e. at memory locations having addresses k+1, k+3 . . . k+2n−1). The method can be implemented on existing hard disk controllers with minimal modifications to the hardware. In addition, an embodiment of the invention allows for decoupling of the XOR operation from disk and host transfers, allowing each of those transfers to occur at their maximum rate and using the remaining buffer bandwidth for the XOR operation.

21 Claims, 15 Drawing Sheets

INTERLEAVED BURST XOR USING A SINGLE MEMORY POINTER

BACKGROUND OF THE INVENTION

1. Field of the invention

The present invention relates generally to a method for protecting information stored on a disk drive and, in particular, to a method of performing Exclusive OR (XOR) operations in a hard disk drive controller.

2. Description of Related Art

A block diagram of a typical disk drive is shown in FIG. 1. Disk drive 150 has a hard disk controller 130 connected to a host interface bus 120. A buffer memory 100 and a microprocessor 160 are connected to hard disk controller 130. A read/write channel 140 further connects hard disk controller 130 to disk 110.

Buffer memory 100 is primarily used as a speed matching FIFO for data transferred between disk 110 and host interface bus 120. For data written from host interface bus 120 to disk 110 ("write data"), hard disk controller 130 fetches the data from host interface bus 120 and writes it to buffer memory 100, which is typically a Dynamic Random Access Memory (DRAM). Hard disk controller 130 fetches the write data from buffer memory 100 and writes the data at the appropriate location on disk 110 through read/write channel 140.

For data read from disk 110 to host interface bus 120 ("read data"), hard disk controller 130 fetches the read data from the appropriate location on disk 110, and writes the read data to buffer memory 100. The data is then read from buffer memory 100 and sent to host interface bus 120.

Note that for both read and write operations, transfers to/from host interface bus 120 and to/from disk 110 typically overlap to reduce operation latency. Thus, buffer memory 100 must have sufficient bandwidth to handle concurrent disk and host transfers.

In recent years, advances in processor performance have far outpaced advances in I/O performance. In addition, the requirement to have 100% on-line protection of user data has become more prevalent. Several subsystem architectures have been developed to deal with these problems. One of the most prevalent techniques has been to incorporate a Redundant Array of Inexpensive Drives (RAID) architecture into the subsystems. RAID is also sometimes said to stand for a Redundant Array of Independent Drives.

RAID architectures are based on storing data on multiple different disk drives, such as disk drive 100, to prevent the loss of user data due to a disk drive failure. By having data stored on more than one disk drive, loss of data caused by the failure of an individual disk drive can be prevented by restoring the data using information on the other disk drives.

Several levels of RAID architectures have been defined, each reflecting a particular balance of data security vs. efficiency of storage space allocation. For example, a RAID 1 architecture simply mirrors the data stored on one disk drive on a second disk drive. RAID 1, therefore, provides a high level of data security, since all the data is stored on two independent disk drives, but uses considerable space, effectively doubling the amount of storage space required.

A RAID 5 architecture, on the other hand, rather than duplicating all the data on one disk drive, simply stores correction code data on a separate disk drive and so improves the storage efficiency. Thus, a RAID 5 architecture ensures adequate data security, i.e. it can recover from a disk drive failure, with minimal use of additional storage space.

As is known to those of skill in the art, a RAID 5 architectures utilizes stripes of data on a plurality of disk drives and uses an Exclusive OR (XOR) function of the stripes of data to generate parity data that is used in the data recovery process and is stored on the separate disk drive. Consequently, the performance of a RAID 5 architecture is related to the performance of the XOR function.

In a typical RAID 5 write operation, the new data is written to the buffer memory from a computer bus, and the old data that will be overwritten is retrieved and stored in the buffer memory. The new data and the old data are simultaneously applied byte-by-byte to an XOR function to generate a bit mask that has a one in every bit that has changed in the new data. The old parity information for the data that is being overwritten is retrieved from the parity disk drive and the bit mask and the old parity data are simultaneously applied byte-by-byte to the XOR function to generate new parity data. The new data and the new parity data are stored in the RAID 5 system.

Regenerating data, that was on a failed disk drive, also requires multiple XOR operations of data from two different data sources. Thus, management of a RAID 5 system requires performing a byte-by-byte XOR operation on data from two different sources. Herein, the sources are referred to as source S1 and source S2 and the resultant XOR data is referred to as parity data X. Sources S1 and S2 are any two of host interface bus 120, disk 110 or buffer memory 100. The destination of parity data X is either disk 110 or host interface bus 120. Additionally, some XOR operations require source S1 to be saved for transfer to a different destination after parity data X is generated.

Since host interface bus 120 and disk 110 operate at different transfer rates, the XOR cannot be performed by concurrently reading data directly from the sources. As a result, one of the sources must first be transferred to buffer memory 100 to perform the XOR in the hard disk controller 130. Once source S1 or source S2 is transferred to buffer memory 100, the data sources for the XOR circuit 200 are buffer memory 100 and either host interface bus 120 or disk 110, as shown in FIGS. 2A–2B.

Typically, a block of memory locations 320 is allocated for the source data in buffer memory 100 and a second block of memory locations 310 is allocated for storing output parity data X after it is generated, as shown in FIG. 3. Blocks 310 and 320 both consist of n bit sets labelled 0 through n–1.

During the XOR operation data is therefore read from memory locations 320, XORed with the data read from the second source 330 and written back to memory locations 310. The speed with which this operation is conducted clearly affects the performance of the hard drive. Several methods can be used to conduct this operation.

In the simplest method, known as single-access XOR, each bit set is read from buffer memory 100 as the corresponding bit set is received from second source 330, the two bit sets are XORed by XOR circuit 200 and the result is written back to buffer memory 100. That is, hard disk controller 130 sequentially alternates between a single-bit-set read access and a single-bit-set write access of buffer memory 100, as shown in FIG. 4. This scheme uses two pointers into buffer memory 100, one pointer for the source data and one pointer for the XORed data. The number of clock cycles needed to XOR each bit set is equal to the number of clock cycles required to read and write a bit set. For example, in the case of the AIC-8321 hard disk controller, that is available from Adaptec, Inc. of Milpitas, Calif., the XOR throughput is 12 clock cycles per bit set (6 cycles for the read and 6 cycles for the write).

DRAMs, however, allow for an optimal access rate when data is accessed in bursts of a certain size. For example, in the case of the AIC-8321, with a standard Fast Page Mode DRAM, it takes 20 clock cycles to read or write a burst of 8 bit sets. Therefore, if the XOR were executed on blocks of 8 bit sets, it would take 40 cycles to XOR each 8 bit set block (20 cycles for the read and 20 cycles for the write), for an average of 5 cycles per bit set, as shown in FIG. 5.

However, to implement this scheme, known as burst XOR, on existing hard disk controllers such as the AIC-8321, additional hardware is required for storing a full burst of data (register file, RAM, etc.).

There is thus a need for a method to perform RAID 5 XOR operations which allows for faster execution, without requiring extensive hardware to be added to existing hard disk controllers.

SUMMARY OF THE INVENTION

The present invention provides a method for performing XOR operations on a hard disk drive that optimizes the buffer bandwidth with minimal logic added to the hard disk controller integrated circuit. This is achieved by first storing data from a first source in a buffer memory in an interleaved fashion (i.e., at memory locations having addresses k, k+2 . . . ,k+2n−2) and then sequentially reading each bit set from the buffer memory, XORing it with a corresponding bit set read from a second source and writing the result at the next consecutive location in the buffer memory (i.e., at memory locations having addresses k+1, k+3 . . . k+2n−1).

The present invention represents a significant performance improvement over single-access XOR without requiring additional hardware to store the entire burst within the hard disk controller. In addition, the invention requires only one buffer memory pointer rather than the two pointers required by prior art methods.

As a result, the present invention can be implemented on existing hard disk controllers with minimal modifications to the hardware.

One embodiment of the present invention allows for decoupling of the XOR operation from both disk and host transfers by storing both sources of data in a buffer memory before they are XORed, allowing each of those transfers to occur at their maximum rate and using the remaining buffer bandwidth for the XOR operation.

DETAILED DESCRIPTION

According to the principles of this invention, XOR operations are performed in a way that reduces the latency associated with RAID 5 operations and requires the addition of minimal or no hardware to existing hard disk controllers. In particular, the multiple distinct memory accesses required by the prior art XOR operations have been eliminated through the methods of this invention.

As explained more completely below, information used in performing the methods of this invention are arranged in memory so that only a single pointer is required to address the memory This is particularly advantageous because in memories such as DRAMs, the time required to access a specific location in memory (overhead) is significant in relationship to the time required to access other memory locations within a predefined address range (the current DRAM page), once the first location has been accessed. Therefore, the high overhead associated with a single memory access with each XOR operation has been eliminated.

In addition unlike the prior art, that requires extensive hardware to be added to the disk controller to perform burst XOR operations, the methods of this invention do not require complex modification of the disk controllers. Consequently, the methods of this invention are easily implemented in existing disk controllers, as explained more completely below.

Figures 6A, 6B:
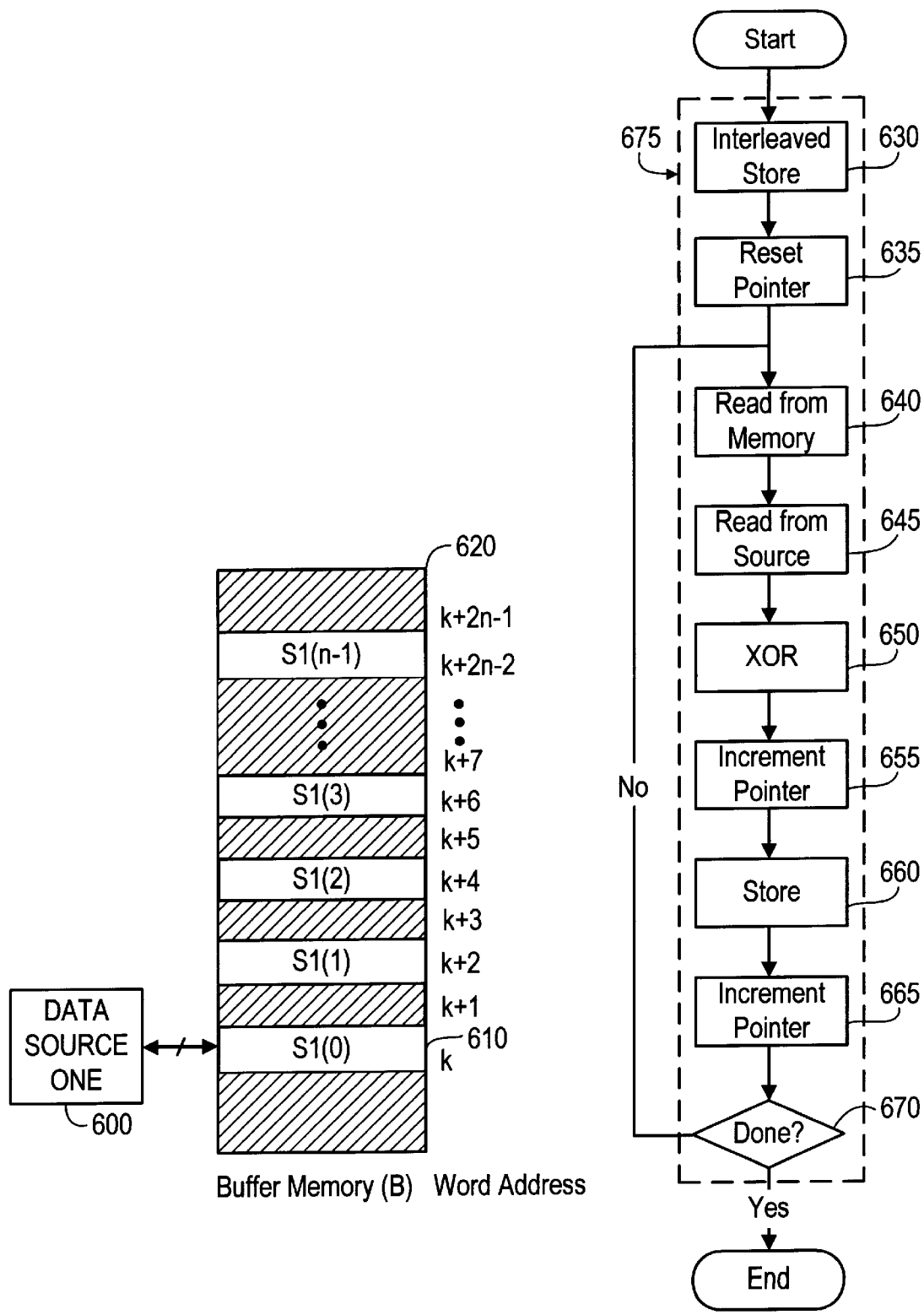
FIG. 6A illustrates the contents of a buffer memory before an interleaved burst XOR operation according to one embodiment of the present invention.
FIG. 6B is a flow diagram of an interleaved burst XOR operation according to one embodiment of the present invention.

In the interleaved burst XOR method 675 of FIG. 6B, n bit sets S1(0), S1(1), . . . , S1(n−1) from a first data source 600 are initially stored in a buffer memory 620 in an interleaved fashion by skipping every other bit set storage location in interleave store operation 630, as shown in FIGS. 6A–6B. As used herein, the term "bit set" indicates a set of an arbitrary number of bits. For example, in some embodiments each bit set has 8 bits, in other embodiments each bit set has 16 bits, yet in other embodiments each bit set has 32 bits, etc. Specifically, a first bit set S1(0) from first data source 600 is stored in an arbitrary bit set storage location in buffer memory 610, that is at buffer memory address k. After storing bit set S1(0), the buffer memory address is incremented by two and a second bit set S1(1) is stored in the bit set storage location with buffer memory address k+2; a third bit set S1(2) is stored in the bit set storage location with buffer memory address k+4; etc. Eventually, a last bit set S1(n−1) is stored in the bit set storage location with buffer memory address k+2n−1, where n is the number of bit sets in a block of data from first data source 600.

After the n bit sets of data are stored in an interleaved fashion in buffer memory 620 in operation 630, reset pointer operation 635 in the interleaved burst XOR method of FIG. 6B resets a pointer used to address buffer memory 620 to buffer memory address k and transfers to read from memory operation 640. The various operations in the method of FIG. 6B are shown in a linear order. This order is for ease of discussion only. Those of skill in the art will appreciate that some of the operations could be performed in parallel, and that the order of the operations is important only to the extent that the pointer, described below, has the correct value and the correct operands and results are utilized.

Read from memory operation 640 reads a bit set from buffer memory 620 at the storage location addressed by the pointer. Thus, in the first entry to read from memory operation 640, a first bit set S1(0) is read from memory 620 and is applied to a first input bus S1 750 of XOR circuit 760, as shown in FIG. 7.

Figure 1:
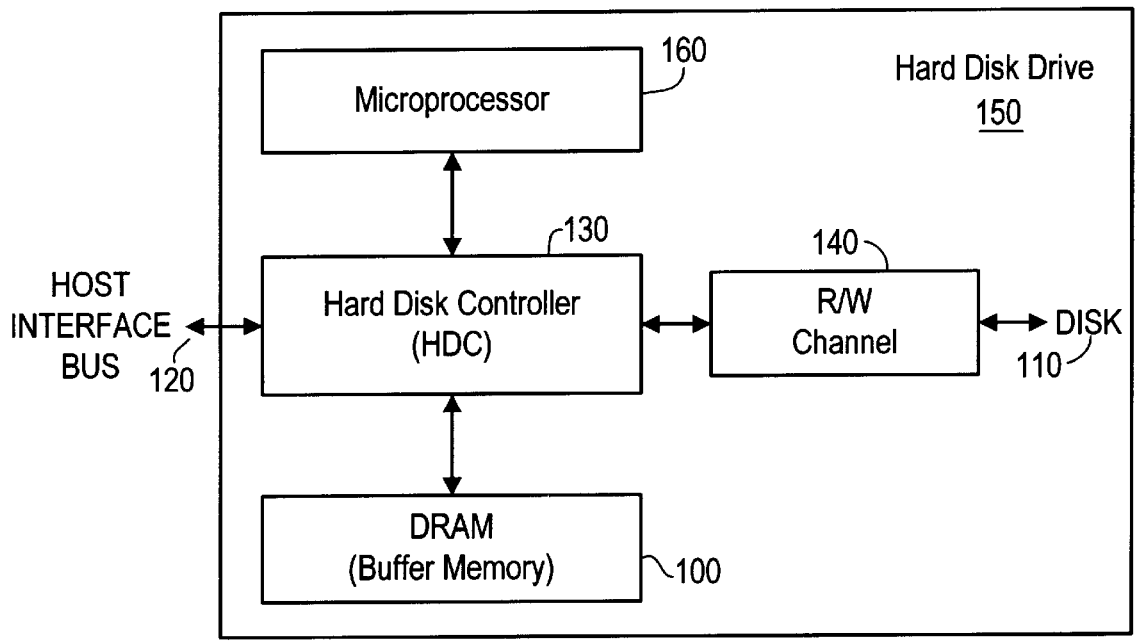
FIG. 1 is a block diagram showing the structure of a typical prior art hard disk drive.
Figure 2A:
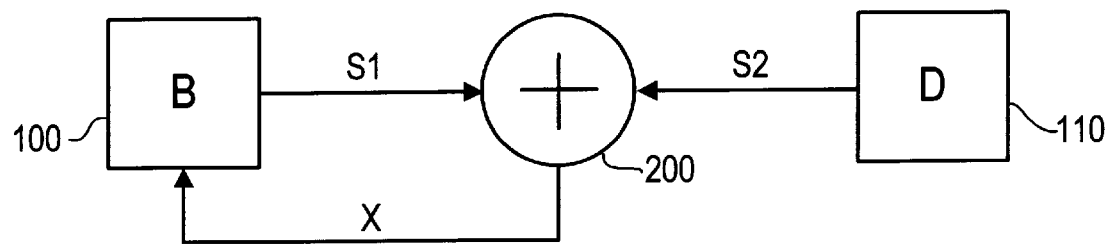
FIGS. 2A and 2B are block diagrams illustrating disk XOR and host XOR operations, respectively.
Figure 2B:
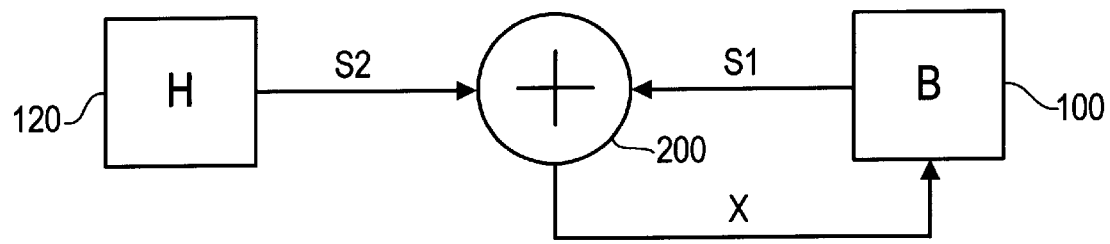
Figure 3:
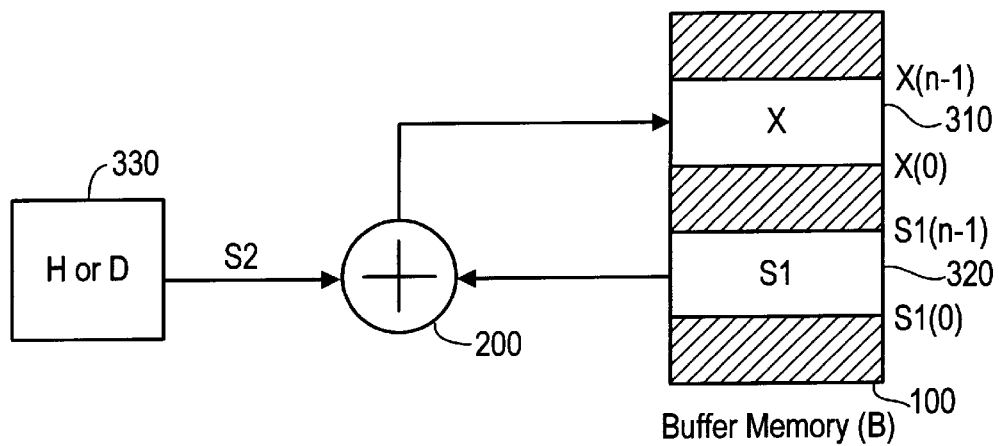
FIG. 3 is a block diagram of an XOR operation in which one source is stored in a buffer memory.
Figure 4:
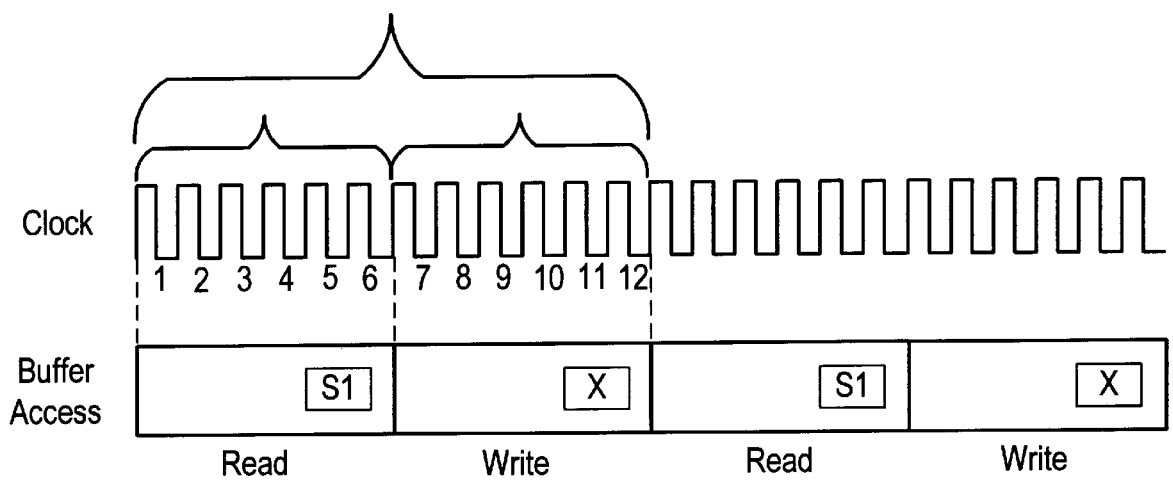
FIG. 4 is a timing diagram of a single access XOR operation.
Figure 5:
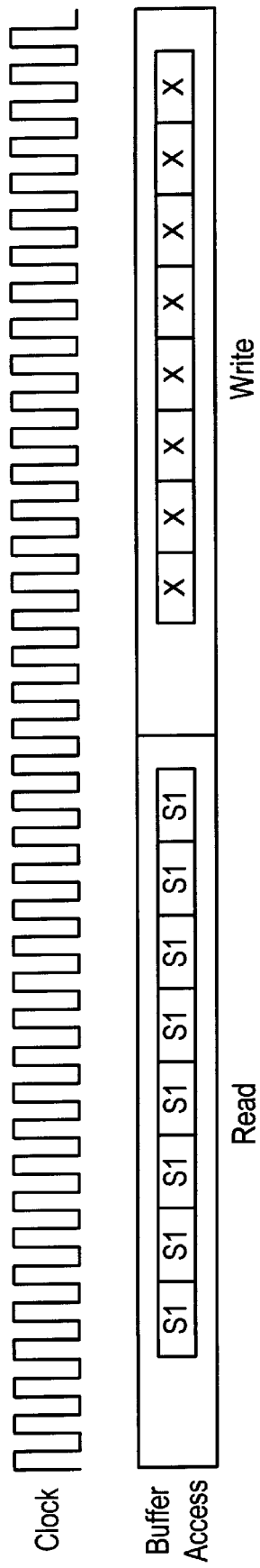
FIG. 5 is a timing diagram of a burst XOR operation.
Figure 7:
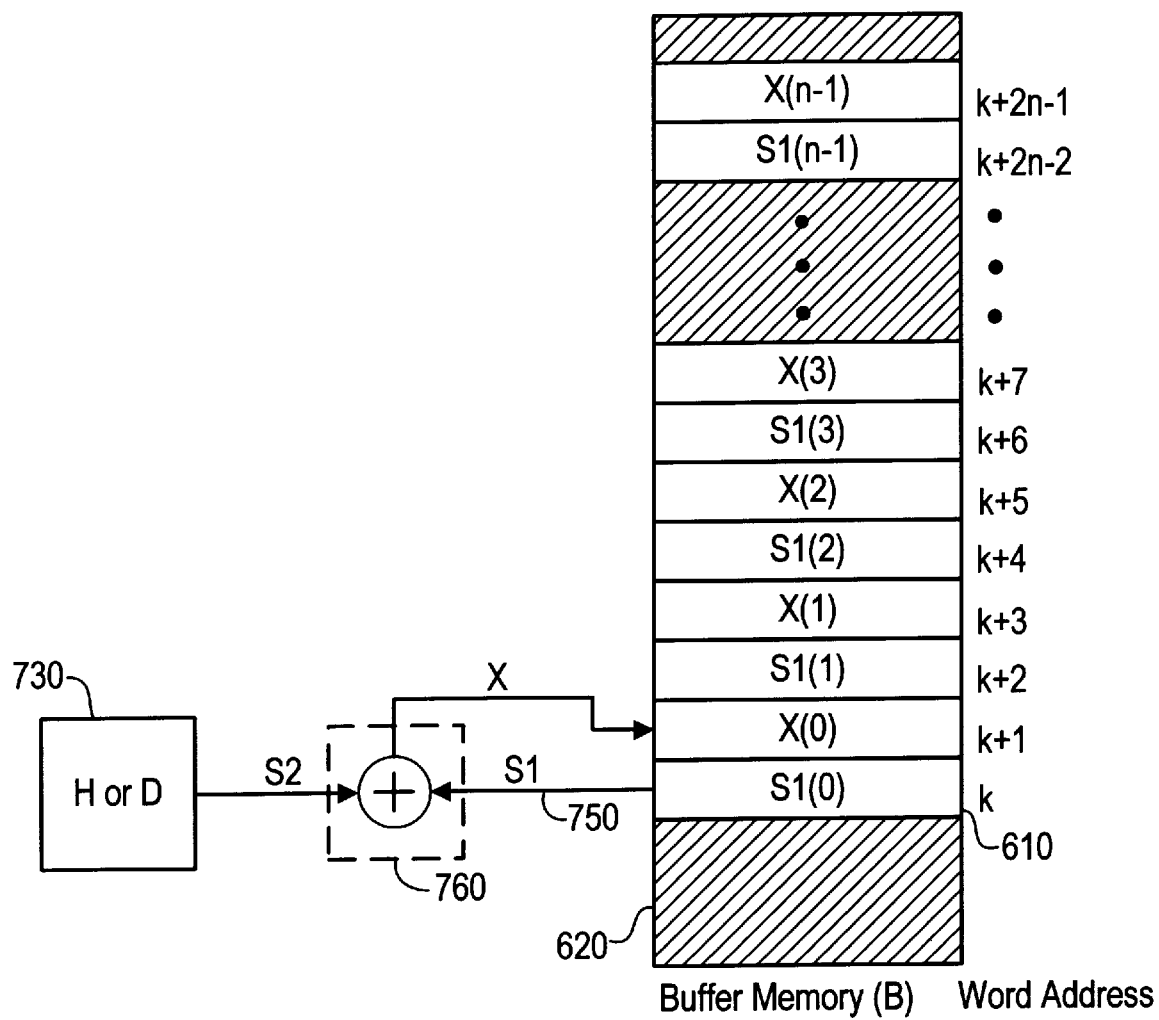
FIG. 7 shows the contents of a buffer memory during an interleaved burst XOR operation according to one embodiment of the present invention.

Read from memory operation 640 transfers processing to a read from source operation 645 that supplies a bit set from a second data source 730 on a second input bus S2 of XOR circuit 760 simultaneously with the bit set on first input bus S1, as shown in FIG. 7. In the first entry to read from source operation 645 (FIG. 6B), a first bit set S2(0) is read from source 730, which can be either a host interface bus 120 or a disk 110 (FIG. 1).

Upon completion of read from source operation 645, processing transfers to XOR operation 650. In operation 650, XOR circuit 760 forms the XOR of the two bit sets on input busses S1 and S2 and the resulting bit set X(i) is output on bus X of XOR circuit 760. After the data bit set is read from memory 620 in read from memory operation 640, update pointer operation 655 increments the pointer to the buffer memory to point to the next consecutive storage location in buffer memory 620.

Hence, store operation 660 stores resulting bit set X(i) at the bit set storage location addressed by the pointer, which for the first bit sets S1(0) and S2(0) is the buffer memory bit set storage location at buffer memory address k+1.

Upon completion of store operation 660, update pointer operation 665 increments the pointer to the buffer memory to point to the next consecutive storage location. After the pointer has been updated, done check operation 665 determines whether the pointer is equal to address k+2n. If all of the data has been processed and the pointer is equal to address k+2n, the method of FIG. 6B is complete and so processing is stopped. Conversely, if the pointer in not equal to address k+2n, data remains to be processed and processing returns to read from memory operation 640.

Operations are performed for each bit set S1(0) to S1(n−1) stored in buffer memory 620. Thus, last bit set S1(n−1) from first data source is read from the memory location at address k+2n−2, XORed with the last bit set of the second data source and result X(n−1) is written back to the memory location at address k+2n−1 of buffer memory 620 (FIG. 7). Note that interleaved burst XOR method 675 only requires one pointer into buffer memory 620 since accesses are sequential during the XOR operation.

Figure 8:
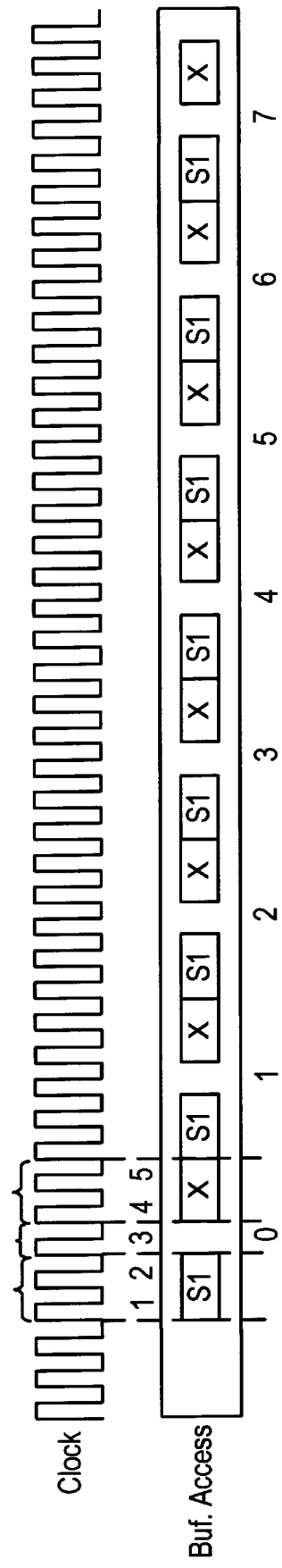
FIG. 8 shows the timing of an interleaved burst XOR operation according to one embodiment of the present invention.

The timing of an interleaved burst XOR operation for a burst of 8 bit sets using a disk controller, such as disk controller Model No. AIC-8323, available from Adaptec of Milpitas, Calif., with a standard Fast Page mode DRAM is shown in FIG. 8. Disk controller AIC-8323 is analogous to disk controller AIC-8321, but can support interleaved burst XOR operations. In addition to 4 cycles of overhead (3 cycles for the DRAM row access at the start of a burst and 1 cycle of precharge time at the end of a burst), it takes 5 cycles to XOR each bit set: 2 cycles to read the bit set, 1 cycle for XORing the two bit sets, and 2 cycles to write the XORed bit set back into the buffer. The XOR of a burst of 8 bit sets takes 4+8*5=44 cycles, for an average of 5.5 clock cycles per bit set. Thus, interleaved burst XOR method 675 performs almost as well as burst XOR, but without requiring only minimal hardware to be added to existing hard disk controllers.

Figure 13:
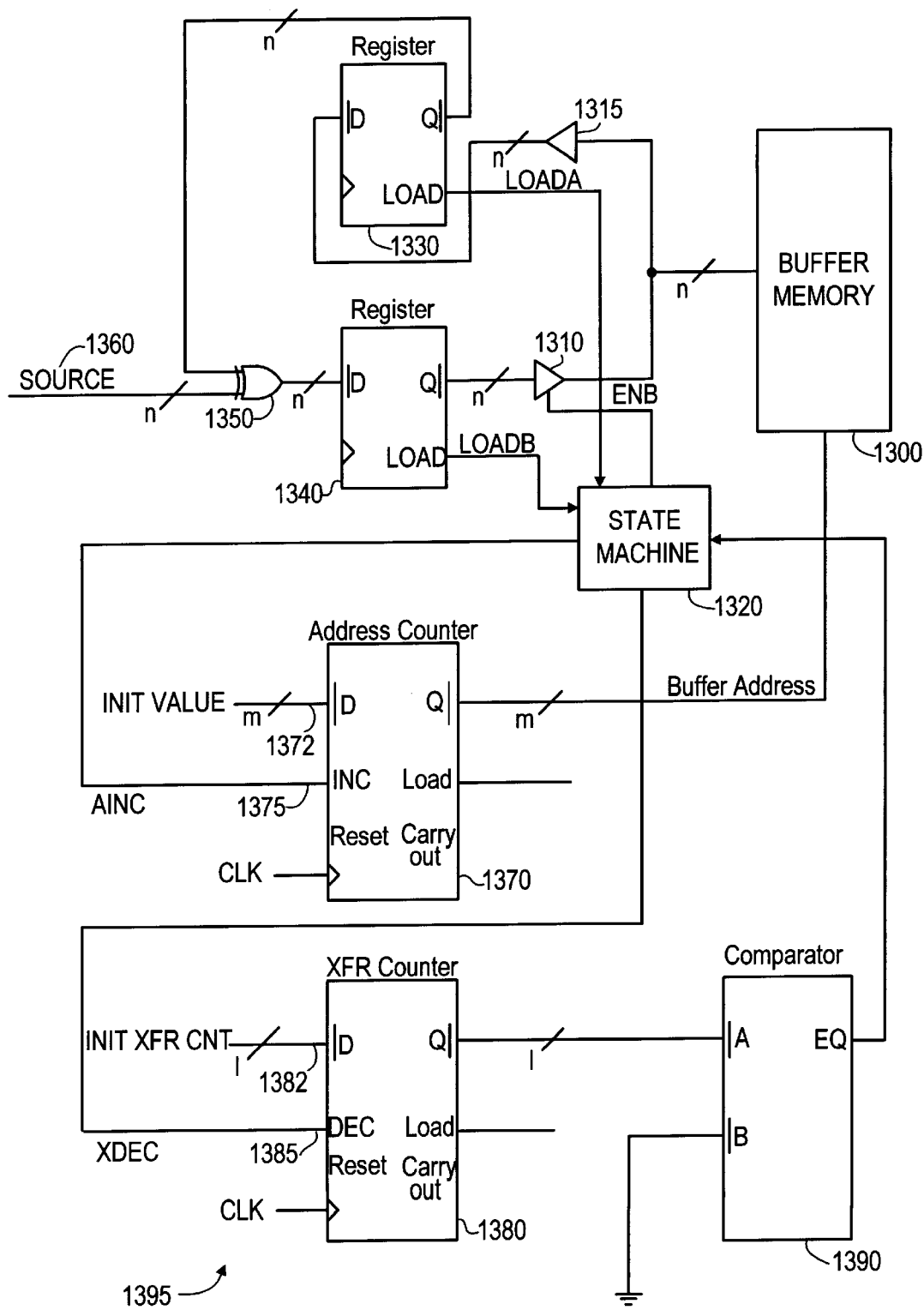
FIG. 13 is a block diagram of an integrated circuit according to one embodiment of the present invention.

Interleaved burst XOR method 675 can be implemented on an existing hard disk controller, such as the AIC-8321, by the logic circuit 1395 of FIG. 13. In FIG. 13, buffer memory 1300 is connected to an input bus of buffer circuit 1315 and to an output bus of tristate buffer circuit 1310. An output bus from buffer circuit 1315 in turn drives registers 1330, whose output bus is tied to one set of input terminals of XOR gate circuit 1350. Another set of input terminals of XOR gate circuit 1350 is tied to an input data source 1360. Input data source 1360 can be either disk 110 or host interface bus 120, shown in FIG. 1. An output bus of XOR gate circuit 1350 drives registers 1340, whose output bus drives tristate buffer circuit 1310.

An output bus of address counter 1370 is connected to an address port of buffer memory 1300, while an output bus of transfer counter 1380 drives a comparator circuit 1390, whose other input is grounded. An output bus of comparator 1390 is connected to state machine 1320. State machine 1320 is in turn connected to an enable port of tristate buffer circuit 1310, to an increment address port 1375 of address counter 1370, to a decrement transfer count port 1385 of transfer counter 1380 and to load ports of registers 1330 and 1340.

Tristate buffer circuit 1310 and registers 1330 and 1340 are controlled by state machine 1320 (whose operation is described below) to route data read from buffer memory 1300, through registers 1330, to XOR gate circuit 1350 and the output of the XOR gate circuit back to buffer memory 1300, through registers 1340 and tristate buffer circuit 1310. Address counter 1370 is used to address the buffer memory and transfer counter 1380 is used to determine when the transfer is complete.

Figure 14:
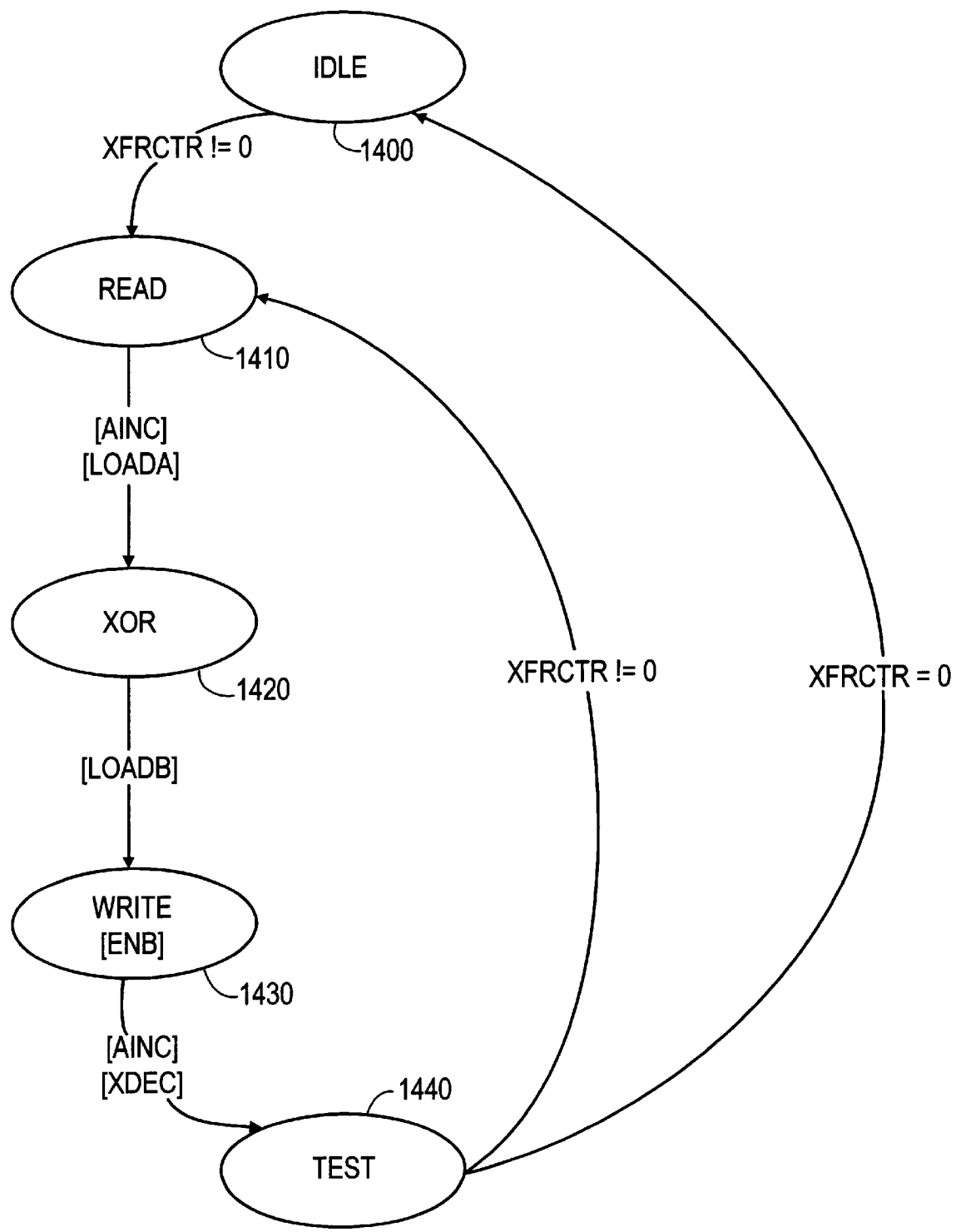
FIG. 14 shows a state machine used to control the operation of the integrated circuit of FIG. 13.

To perform an interleaved burst XOR operation using logic circuit 1395, a transfer count, representing the number of bit sets of data to be XORed, is loaded in transfer counter 1380 through an initial data count port 1382 and an address, representing the starting address at which the data to be XORed is stored in buffer memory 1300, is loaded in address counter 1370 through an initial value port 1372. Upon determining that transfer counter 1380 has a non-zero value (XFRCTR !=0), state machine 1320 transitions from IDLE state 1400 (FIG. 14), to READ state 1410. During READ state 1410, the first bit set of the data to be XORed is read from buffer memory 1300 (FIG. 13) into registers 1330.

State machine 1320 transitions from READ state 1410 to XOR state 1420, and a signal tied to increment address port 1375 of address counter 1370 is asserted, which causes the value stored in address counter 1370 to be incremented by a fixed amount. In addition, a signal tied to a load port of registers 1330 is asserted, causing an n-bit value on a set of input terminals of registers 1330 to be loaded into registers 1330. During XOR state 1420, the n-bit value stored in registers 1330 is routed to the first set of input terminals of XOR gate circuit 1350 and an n-bit value, read from source 1360 during read state 1410, is routed to the other set of input terminals of XOR gate circuit 1350 and the output signal of XOR gate circuit 1350 is routed to registers 1340. State machine 1320 transitions from XOR state 1420 to WRITE state 1430, and a signal tied to a load port of registers 1340 is asserted, causing an n-bit value on a set of input terminals of registers 1340 to be loaded into registers 1340. During WRITE state 1430, the n-bit XORed value stored in registers 1340 is routed back to an input set of buffer memory 1300, by asserting a signal tied to an enable port of tristate buffer 1310. The value is thus written into buffer memory 1300 at a location having an address equal to the address from which the first source data was read plus an increment.

State machine 1320 transitions from WRITE state 1430 to TEST state 1440. State machine 1320 then asserts a signal tied to an increment address port 1375 of address counter 1370, causing the value stored in address counter 1370 to be incremented, and a signal tied to a decrement transfer count port 1385 of transfer counter 1380, causing the value stored in transfer counter 1380 to be decremented. During TEST state 1440, the output of transfer counter 1380 is fed to one set of input terminals of comparator circuit 1390, whose other set of input terminals is grounded and the output of comparator 1390 is fed back to state machine 1320. Upon determining that the value stored in transfer counter 1380 is equal to zero (XFRCTR=0), state machine 1320 transitions back to IDLE state 1400. Alternatively, upon determining that transfer counter 1380 has a non-zero value (XFRCTR !=0), state machine 1320 transitions back to READ state 1410.

Circuit 1395 (FIG. 13), can be implemented in a prior art hard disk controller, such as an AIC-8321, using existing circuit elements. In some embodiments, such a circuit could be added to an existing hard disk controller or the circuit could be implemented using a combination of new and existing circuit elements of the disk controller.

Figures 9A, 9B:
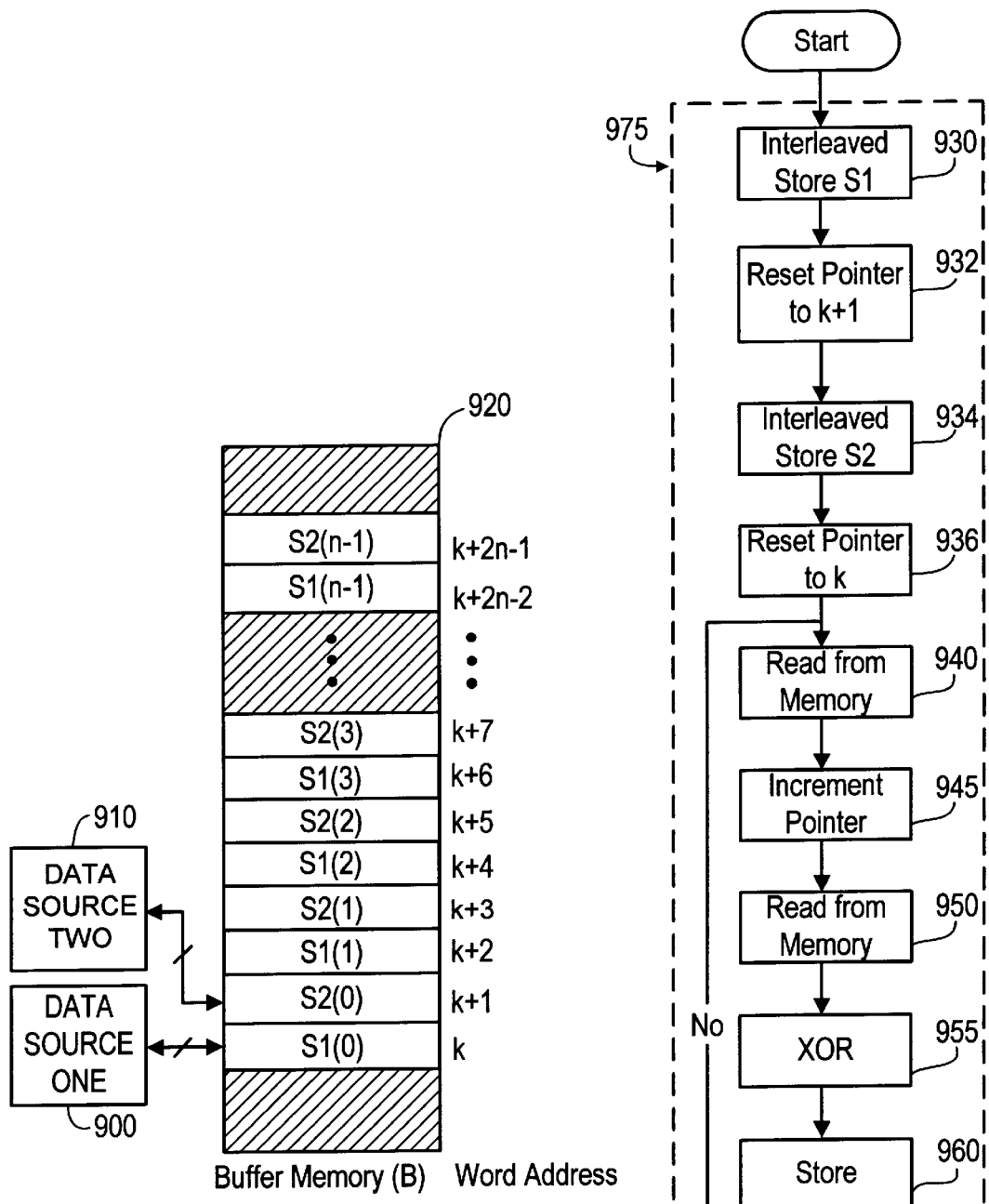
FIG. 9A illustrates the contents of a buffer memory before a background interleaved burst XOR operation according to one embodiment of the present invention.
FIG. 9B is a flow diagram of a background interleaved burst XOR operation according to one embodiment of the present invention.

According to another embodiment of the invention, known as a background interleaved burst XOR method 975, data from both sources is transferred to a buffer memory before performing the XOR operation. Data from the two sources is interleaved, as shown in FIGS. 9A–9B.

In stage 930, a first bit set S1(0) of a first data source 900 is written into an arbitrary storage location of buffer memory 920 that is at buffer memory address k. After storing bit set S1(0), the buffer memory address is incremented by two and bit set S1(1) is stored at a location of buffer memory 920 that is at buffer memory address k+2, etc. Eventually, a last bit set S1(n−1) of first data source 900 is stored in a bit set storage location with buffer memory address k+2n−2, where n is the number of bit sets from first data source 900. The buffer memory address is then reset to k+1, in stage 932. In stage 934, a first bit set S2(0) of a second data source 910 is written into a storage location of buffer memory 920 that is at buffer memory address k+1. After storing bit set S2(0), the buffer memory address is then incremented by two and bit set S2(1) is stored at a location of buffer memory 920, that is at buffer memory address k+3, etc. Eventually, a last bit set S2(n−1) of second data source 910 is stored in a bit set storage location with buffer memory address k+2n−1. The buffer memory address is then reset to k, in stage 936.

Since both sources, as well as the destination data, reside in buffer memory 920, the XOR operation can be performed "in the background" without being directly tied to the transfer rate of either host interface bus 120 or disk 110.

After the 2n bit sets of data are stored in an interleaved fashion in buffer memory 920, background interleaved burst XOR method 975 (FIG. 9B) transfers to read from memory operation 940. The various operations in the method of FIG. 9B are shown in a linear order. This order is for ease of discussion only. Those of skill in the art will appreciate that some of the operations could be performed in parallel, and that the order of the operations is important only to the extent that the pointer, described below, has the correct value and the correct operands and results are utilized.

Figure 10:
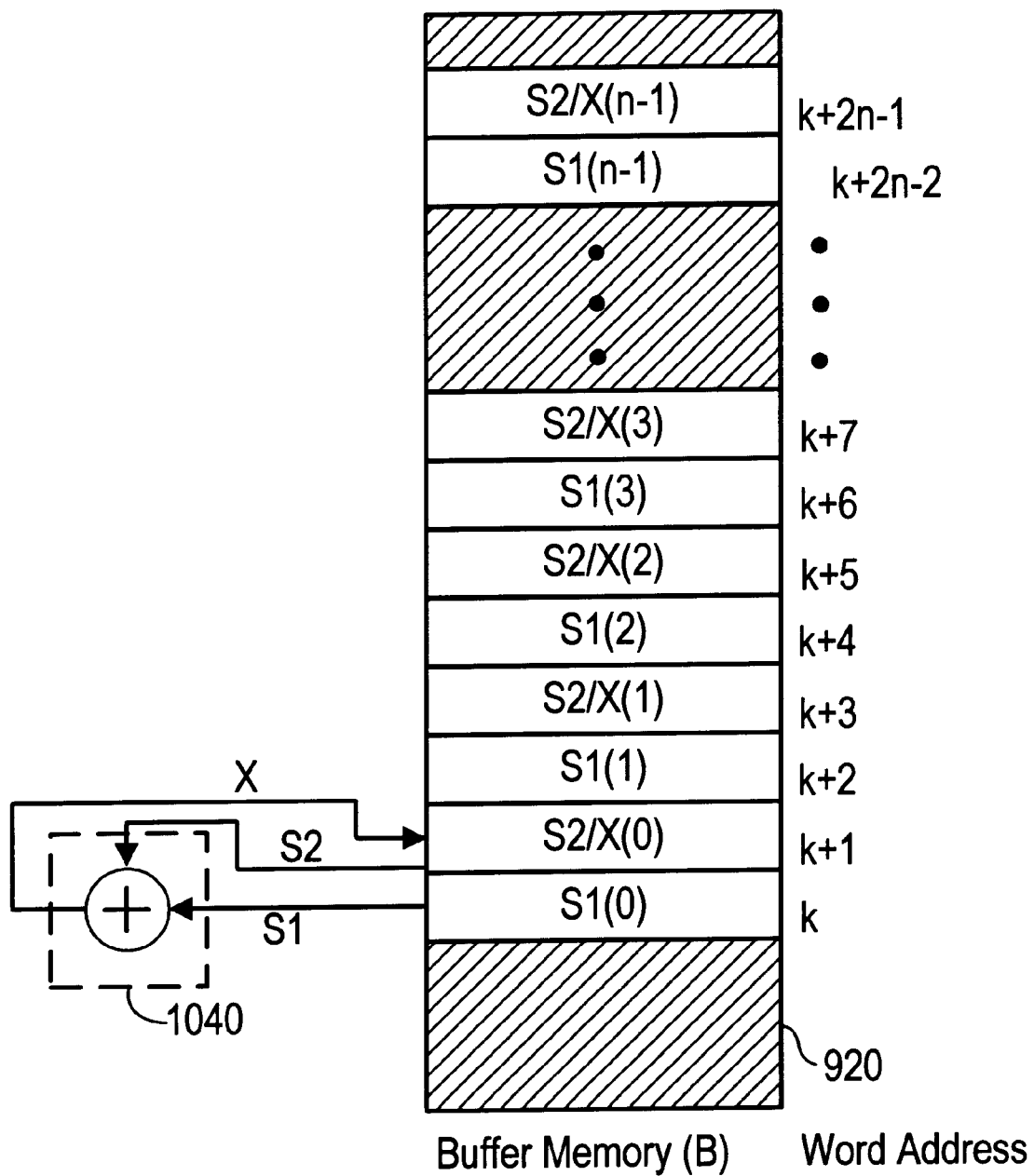
FIG. 10 shows the contents of a buffer memory during a background interleaved burst XOR operation according to one embodiment of the present invention.

Read from memory operation 940 reads a bit set from buffer memory 920 at the storage location addressed by the pointer. Thus, in the first entry to read from memory operation 940, a first bit set S1(0) of first data source 900 is read from memory 920 and is applied to a first input bus S1 of XOR circuit 1040 (FIG. 10).

After read from memory operation 940 is completed, the pointer to the buffer memory 920 is updated to point to the next consecutive location by increment pointer operation 945. Read from memory operation 950 then reads a second bit set from buffer memory 920 at the storage location addressed by the pointer and supplies a bit set from second data source 910 on a second input bus S2 of XOR circuit 1040 simultaneously with the bit set on first input bus S1, as shown in FIG. 10.

Upon completion of read from memory operation 950, processing transfers to XOR operation 955. In operation 955, XOR circuit 1040 forms the XOR of the two bit sets on input busses S1 and S2 and resulting parity bit set X(i) is output on bus X of XOR circuit 1040.

Hence, store operation 960 stores resulting parity bit set X(i) at the bit set storage location addressed by the pointer, which for the first bit sets S1(0) and S2(0) is the buffer memory bit set storage location at buffer memory address k+1, thus overwriting the value stored for S2(0).

Upon completion of store operation 960, update pointer operation 965 increments the pointer to the buffer memory to point to the next consecutive storage location. After the pointer has been updated, done check operation 965 determines whether the pointer is equal to address k+2n. If all of the data has been processed and the pointer is equal to address k+2n, the method of FIG. 9B is complete and so processing is stopped. Conversely, if the pointer in not equal to address k+2n, data remains to be processed and processing returns to read from memory operation 940.

Operations are performed for each bit set S1(0) to S1(n−1) of first data source 900 and S2(0) to S2(n−1) of second data source 910 stored in buffer memory 920. Thus, last bit set S1(n−1) from first data source 900 is read from the memory location at address k+2n−2, the last bit set S2(n−1) from second data source 910 is read from the memory location at address k+2n−1 and result X(n−1) is written back to the memory location at address k+2n−1 of buffer memory 920. This process is shown in FIG. 10.

As with interleaved burst XOR method 675 (FIG. 6B), background interleaved burst XOR method 975 only requires one pointer into buffer memory 920, since the memory is accessed sequentially during interleaved burst XOR method 975.

Figure 11:
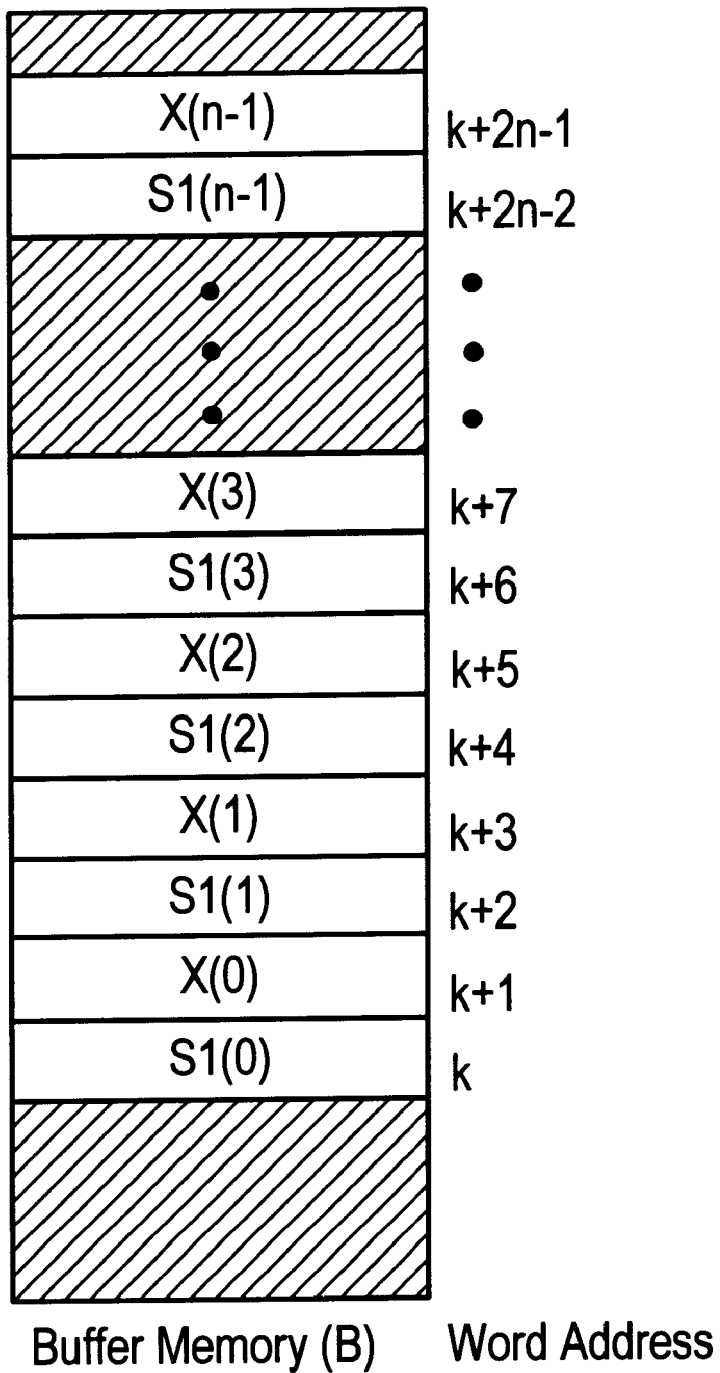
FIG. 11 shows the contents of a buffer memory after a background interleaved burst XOR operation according to one embodiment of the present invention.
Figure 12:
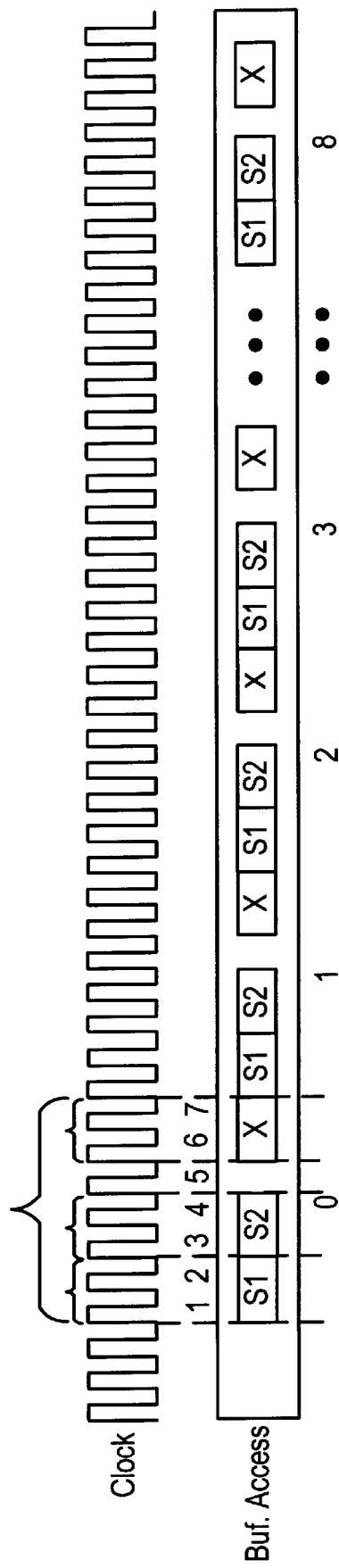
FIG. 12 shows the timing of a background interleaved burst XOR operation according to one embodiment of he present invention.

The contents of the buffer memory after the XOR operation are shown in FIG. 11. The timing of a background interleaved burst XOR operation is shown in FIG. 12.

If background interleaved burst XOR were used in the AIC-8323, the time required to XOR a burst of 8 bit sets would be 4 cycles of overhead (3 cycles for the DRAM row access at the start of the burst and 1 cycle of precharge time at the end of burst) plus 7 cycles to XOR each bit set: 2 cycles to read the first source bit set, 2 cycles to read the second source bit set, 1 cycle for XORing the two bit sets, and 2 cycles to write back the XORed value. The XOR of a burst of 8 bit sets would take 4+8*7=60 cycles, for an average of 7.5 clocks per bit set. Thus, even though background interleaved burst XOR method 975 does not perform as well as burst XOR, it significantly outperforms single access XOR and requires only minimal hardware to be added to existing hard disk controllers.

Figure 15:
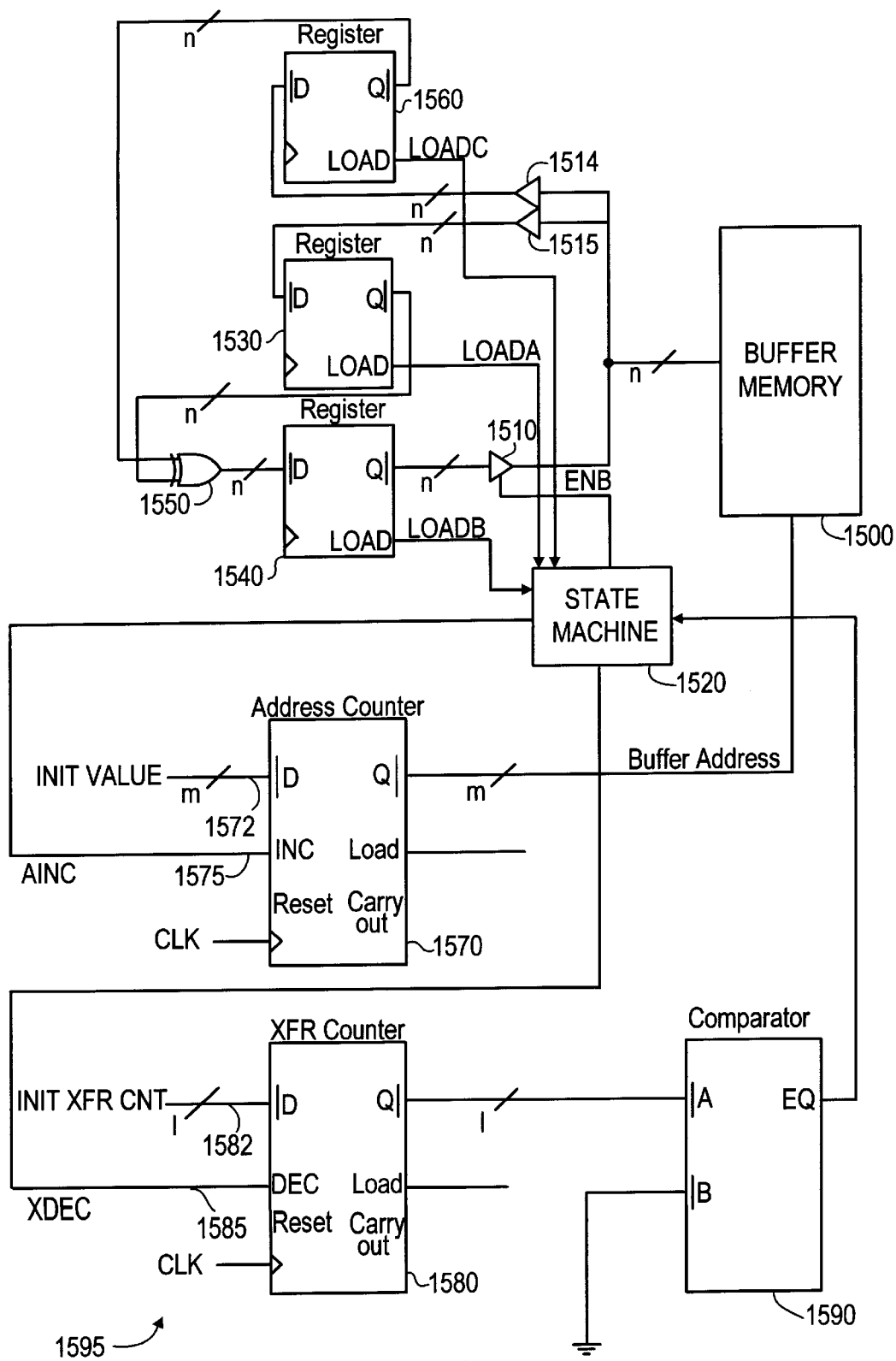
FIG. 15 is a block diagram of an integrated circuit according to one embodiment of the present invention.

Background interleaved burst XOR method 975 can be implemented on an existing hard disk controller, such as the AIC-8321, by the logic circuit 1595 of FIG. 15. In FIG. 15, buffer memory 1500 is connected to an input bus of buffer circuits 1514 and 1515 and to an output bus of tristate buffer circuit 1510. An output bus from buffer circuit 1515 in turn drives registers 1530, whose output bus is tied to one set of input terminals of XOR gate circuit 1550. Likewise, an output bus of buffer circuit 1514 drives registers 1560, whose output bus is tied to the other set of input terminals of XOR gate circuit 1550. An output bus of XOR gate circuit 1550 in turn drives registers 1540, whose output bus drives tristate buffer circuit 1510.

An output bus of address counter 1570 is connected to an address port of buffer memory 1500, while an output bus of transfer counter 1580 drives a comparator circuit 1590, whose other input is grounded. An output bus of comparator circuit 1590 is connected to state machine 1520. State machine 1520 is in turn connected to an enable port of tristate buffer circuit 1510, to an increment address port 1575 of address counter 1570, to a decrement transfer count port 1585 of transfer counter 1580, and to load ports of registers 1530, 1540 and 1560.

Tristate buffer circuit 1510 and registers 1530, 1540 and 1560 are controlled by state machine 1520 (whose operation is described below) to route data read from buffer memory 1500, through registers 1530 and 1560 to XOR gate circuit 1550 and the output of the XOR gate circuit back to buffer memory 1500, through register 1540 and tristate buffer circuit 1510. Address counter 1570 is used to address the buffer memory and transfer counter 1580 is used to determine when the transfer is complete.

Figure 16:
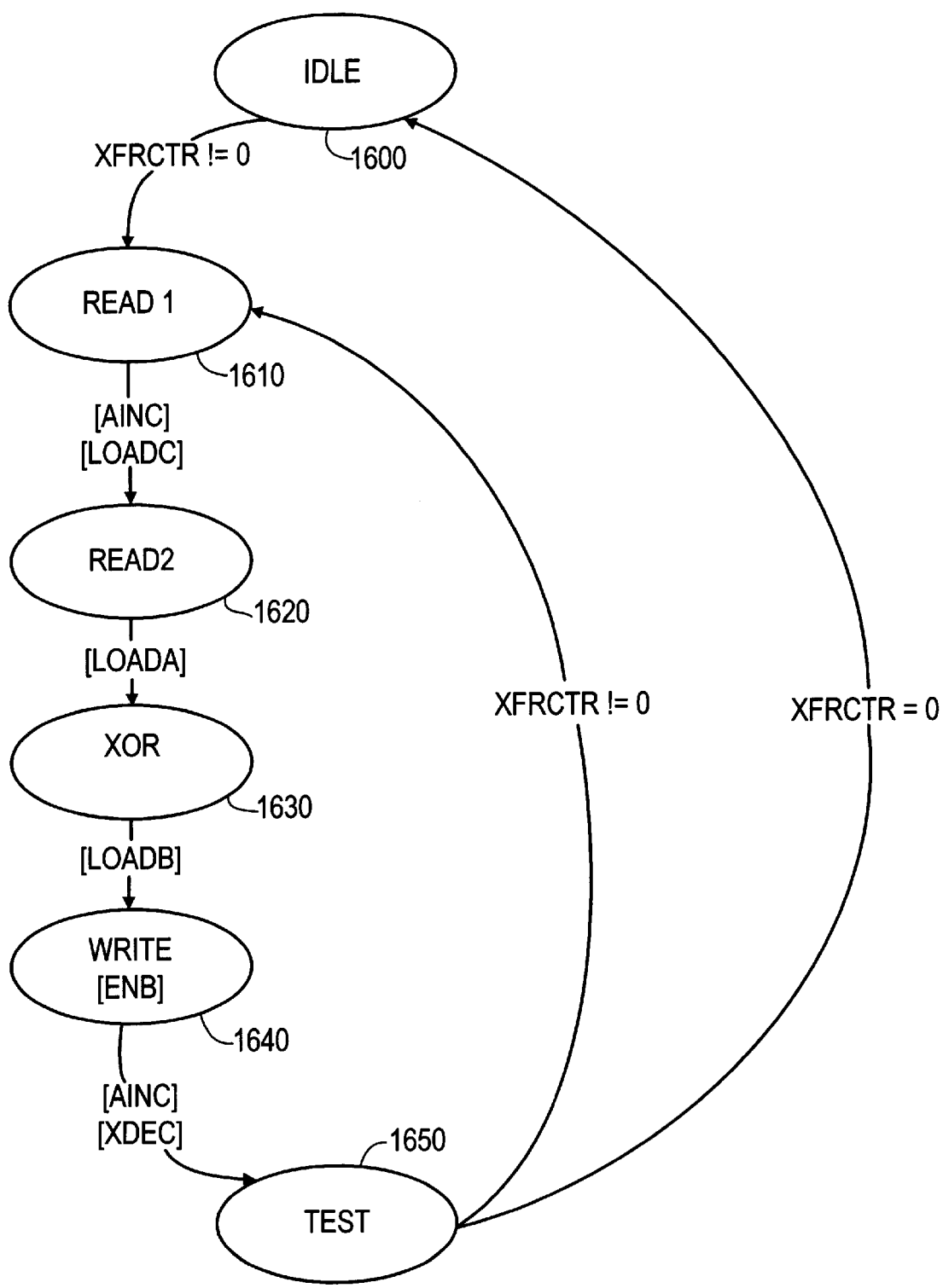
FIG. 16 shows a state machine used to control the operation of the integrated circuit of FIG. 15.

To perform a background interleaved burst XOR operation using the logic circuit 1595, a transfer count, representing the number of bit sets of data to be XORed, is loaded in transfer counter 1580 through an initial transfer count port 1582 and an address, representing the starting address at which the data to be XORed is stored in buffer memory 1500, is loaded in address counter 1570 through an initial value port 1572. Upon determining that transfer counter 1580 has a non zero value (XFRCTR !=0), the state machine transitions from IDLE state 1600 (FIG. 16) to READ1 state 1610. During READ1 state 1610, the first bit set of the first data source is read from buffer memory 1500.

State machine 1520 transitions from READ1 state 1610 to READ2 state 1620, and a signal tied to increment address port 1575 of address counter 1570 is asserted, which causes the value stored in address counter 1570 to be incremented by a fixed amount. In addition, a signal tied to a load port of registers 1560 is asserted, causing an n-bit value on a set of input terminals of registers 1560 to be loaded into registers 1560. During READ2 state 1620, the first bit set of the second data source is read from buffer memory 1500. State machine 1520 then transitions from READ2 state 1620 to XOR state 1630, and a signal tied to a load port of registers 1530 is asserted, causing an n-bit value on a set of input terminals of registers 1530 to be loaded into registers 1530. During XOR state 1630, the n-bit value stored in registers 1530 is routed to the first set of input terminals of XOR gate circuit 1550, the n-bit value stored in registers 1560 is routed to the other set of input terminals of XOR gate circuit 1550, and the output of XOR gate circuit 1550 is routed to registers 1540. State machine 1520 then transitions from XOR state 1630 to WRITE state 1640, and a signal tied to a load port of registers 1540 is asserted, causing an n-bit value on a set of input terminals of registers 1540 to be loaded into registers 1540. During WRITE state 1640, the n-bit XORed value stored in register 1540 is routed back to an input of buffer memory 1500, by asserting a signal tied to an enable port of tristate buffer 1510. The value is thus written into buffer memory 1500 at a location having an address equal to the address from which the second source data was read during READ2 state 1620. State machine 1520 transitions from WRITE state 1640 to TEST state 1650, and a signal tied to increment address port 1575 of address counter 1570, causing the value stored in address counter 1570 to be incremented, and a signal tied to a decrement transfer counter port 1585 of transfer counter 1580, causing the value stored in transfer counter 1580 to be decremented. During TEST state 1650, the output of transfer counter 1580 is fed to one set of input terminals of comparator circuit 1590, whose other set of input terminals is grounded and the output of comparator 1590 is fed back to state machine 1520. Upon determining that the value stored in transfer counter 1580 is equal to zero (XFRCTR=0), the state machine transitions back to IDLE state 1600. Alternatively, upon determining that transfer counter 1580 has a non-zero value (XFRCTR !=0), the state machine transitions back to READ1 state 1610.

Circuit 1595 (FIG. 15), can be implemented in a prior art hard disk controller, such as an AIC-8321, using existing circuit elements. In some embodiments, such a circuit could be added to an existing hard disk controller or the circuit could be implemented using a combination of new and existing circuit elements of the disk controller.

While the invention has been described above in reference to particular embodiments, this description is solely for the purpose of illustration and is not to be construed as limiting the scope of the invention claimed below. In particular, the invention is not limited to any number of sources, any specific hardware implementation or any particular type of buffer memory. The invention can be implemented entirely in hardware, entirely in software or in any combination of hardware and software.

Accordingly, various modifications and adaptations of the above described embodiments may be made by those skilled in the art without departing from the true scope and spirit of the invention as defined by the following claims.

We claim:

1. A method for utilizing a single pointer in processing data in an Exclusive OR operation comprising:
   storing a plurality of bit sets in a semiconductor memory in an interleaved fashion;
   retrieving a bit set in said plurality of bit sets from a first location in said semiconductor memory addressed by a pointer;
   processing said bit set in an exclusive OR operation;
   changing said pointer to address a second location in said semiconductor memory; and storing a result of said exclusive OR operation in said second location of said semiconductor memory.

2. The method of claim 1, wherein said method further comprises:

initializing an address counter with an address of a location in the semiconductor memory prior to storing said plurality of bit sets.

3. The method of claim 1, wherein said method further comprises:

storing a first bit set in said plurality of bit sets at a location having said address.

4. The method of claim 1, wherein said method further comprises:

incrementing said address counter by a value equal to the amount of the semiconductor memory required to store two bit sets.

5. The method of claim 1, wherein retrieving the bit set further comprises:

loading an address of a first bit set of the plurality of bit sets in an address counter;

loading a value in a transfer counter, the value indicating a number of the plurality of bit sets to be processed in the exclusive OR operation;

reading the first bit set from a location of the semiconductor memory corresponding to the address stored in the address counter;

reading a second bit set from a bus;

routing said first bit set to a first input of a circuit for performing the exclusive OR operation;

routing said second bit set to a second input of the circuit; and incrementing the value stored in the address counter by an offset equal to the amount of address space of the semiconductor memory required to store one of the plurality of bit sets.

6. The method of claim 3, wherein the first bit set is stored in a storage device.

7. The method of claim 1, wherein processing the bit set further comprises:

generating an exclusive OR value in a circuit for performing the exclusive OR operation; and storing the exclusive OR value in a storage device.

8. The method of claim 1, wherein storing the result further comprises:

storing the exclusive OR value in the semiconductor memory at a location specified by the value stored in an address counter;

incrementing the value of the address counter by an offset equal to the amount of address space of the semiconductor memory required to store one of the plurality of bit sets; and decrementing the value stored in a transfer counter by a value indicating that one of the plurality of bit sets has been processed.

9. A method for utilizing a single pointer in processing data in an Exclusive OR operation comprising:

storing a plurality of bit sets in a semiconductor memory in an interleaved fashion;

retrieving a first bit set in said plurality of bit sets from a first location in the semiconductor memory addressed by a pointer;

changing said pointer to address a second location in the semiconductor memory;

retrieving a second bit set in said plurality of bit sets from said second location in the semiconductor memory addressed by the pointer;

processing the first bit set and the second bit set in an exclusive OR operation;

storing a result of said exclusive OR operation in the semiconductor memory; and incrementing said pointer.

10. The method of claim 9, wherein storing the plurality of bit sets further comprises:

loading an address counter with an address of a location of the semiconductor memory;

storing the first bit set in the semiconductor memory at a location having an address corresponding to the value stored in the address counter; and incrementing the value stored in the address counter by an offset equal to the amount of address space of the semiconductor memory required to store two of the plurality of bit sets.

11. The method of claim 9, wherein storing the plurality of bit sets further comprises:

loading an address counter with an address of a location of the semiconductor memory;

storing the second bit set in the semiconductor memory at a location having an address corresponding to the value stored in the address counter; and incrementing the value stored in the address counter by an offset equal to the amount of address space of the semiconductor memory required to store two of the plurality of bit sets.

12. The method of claim 9, wherein retrieving the first bit set further comprises:

loading an address of the first bit set in an address counter;

loading a value in a transfer counter, the value indicating a number of the plurality of bit sets to be processed in the exclusive OR operation;

reading the first bit set from a location of the semiconductor memory corresponding to the address stored in the address counter;

incrementing the value stored in the address counter by an offset equal to the amount of address space of the semiconductor memory required to store one of the plurality of bit sets;

reading the second bit set from a location of the semiconductor memory corresponding to the address stored in the address counter;

routing said first bit set to a first input of a circuit for performing the exclusive OR operation; and routing said second bit set to a second input of the circuit.

13. The method of claim 9, wherein the first bit set read from the semiconductor memory is stored in a first storage device and the second bit set read from the semiconductor memory is stored in a second storage device.

14. The method of claim 9, wherein processing the first bit set and the second bit set further comprises:

generating an exclusive OR value in a circuit for performing the exclusive OR operation; and storing the exclusive OR value in a storage device.

15. The method of claim 9, wherein storing the result further comprises:

storing an exclusive OR value in the semiconductor memory at a location specified by the value stored in an address counter;

incrementing the value of the address counter by an offset equal to the amount of address space of the semiconductor memory required to store one of the plurality of bit sets; and decrementing the value stored in a transfer counter by a value indicating that one of the plurality of bit sets has been processed.

16. An apparatus for performing exclusive OR operations on a plurality of bit sets of data comprising:

a semiconductor memory, one or more of the plurality of bit sets of data being stored in the semiconductor memory in an interleaved fashion;

a circuit for performing exclusive OR operations, the circuit generating an exclusive OR value of a first bit set of data stored in the semiconductor memory with a second bit set of data not stored in the semiconductor memory;

means for reading the first bit set from the semiconductor memory;

means for routing the first bit set to the circuit;

means for reading the second bit set from a bus;

means for routing the second bit set to the circuit;

means for routing an output of the circuit to an input of the semiconductor memory; and means for writing the exclusive OR value generated by the circuit into the semiconductor memory at a location immediately following the location of the first bit set.

17. The apparatus of claim 16, wherein at least one element of the apparatus is part of a hard disk controller integrated circuit.

18. The apparatus of claim 16, wherein at least one element of the apparatus is not part of a hard disk controller integrated circuit.

19. An apparatus for performing exclusive OR operations on a plurality of bit sets of data comprising:

a semiconductor memory, one or more of the plurality of bit sets of data being stored in the semiconductor memory in an interleaved fashion;

a circuit for performing exclusive OR operations, the circuit generating an exclusive OR value of a first and a second bit sets of data stored in the semiconductor memory;

means for reading the first bit set from the semiconductor memory;

means for routing the first bit set to the circuit;

means for reading the second bit set from the semiconductor memory at a location immediately following the location of the first bit set;

means for routing the second bit set to the circuit;

means for routing an output of the circuit to an input of the semiconductor memory; and means for writing the exclusive OR value generated by the circuit into the semiconductor memory at the location of the second bit set.

20. The apparatus of claim 19, wherein at least one element of the apparatus is part of a hard disk controller integrated circuit.

21. The apparatus of claim 19, wherein at least one element of the apparatus is not part of a hard disk controller integrated circuit.

* * * * *

UNITED STATES PATENT AND TRADEMARK OFFICE
CERTIFICATE OF CORRECTION

PATENT NO. : 5,946,707
DATED : August 31, 1999
INVENTOR(S) : Krakirian, Shahe H.

It is certified that error appears in the above-identified patent and that said Letters Patent is hereby corrected as shown below:

Column 5,
Line 56, delete "in" and insert -- is --.

Column 6,
Line 15, delete "without".

Column 18,
Line 47, delete "in" and insert -- is --.

Signed and Sealed this

Twenty-sixth Day of February, 2002

Attest:

JAMES E. ROGAN
Attesting Officer    Director of the United States Patent and Trademark Office